United States Patent [19]

Strange et al.

[11] Patent Number: 6,107,889
[45] Date of Patent: Aug. 22, 2000

[54] PHASE LOCKED LOOP CHARGE PUMP CIRCUIT

[75] Inventors: Jonathan R. Strange, Reigate; Ashish D. Shah, Chatham, both of United Kingdom

[73] Assignee: Analog Devices, Inc., Norwood, Mass.

[21] Appl. No.: 08/966,333

[22] Filed: Nov. 7, 1997

[51] Int. Cl.[7] .................................................. H03L 7/08
[52] U.S. Cl. ......................... 331/17; 331/16; 327/156; 327/157; 327/536; 327/537; 375/374
[58] Field of Search .................................. 331/17, 18, 16; 327/536, 156, 157, 537; 375/374

[56] References Cited

U.S. PATENT DOCUMENTS

| | | | |
|---|---|---|---|
| 4,689,581 | 8/1987 | Talbot | 331/1 A |
| 4,814,726 | 3/1989 | Byrd et al. | 331/1 A |
| 5,184,028 | 2/1993 | Zobel | 327/109 |
| 5,416,691 | 5/1995 | Croughwell | 363/60 |
| 5,420,545 | 5/1995 | Davis et al. | 331/17 |
| 5,473,283 | 12/1995 | Luich | 331/8 |
| 5,508,660 | 4/1996 | Gersbach et al. | 331/17 |
| 5,576,647 | 11/1996 | Sutardja et al. | 327/108 |

FOREIGN PATENT DOCUMENTS

| | | |
|---|---|---|
| 0778510 | 6/1997 | European Pat. Off. . |
| 2198562 | 6/1988 | United Kingdom . |

*Primary Examiner*—Arnold Kinkead
*Attorney, Agent, or Firm*—Samuels, Gauthier & Stevens, LLP

[57] ABSTRACT

A charge pump circuit including current source circuits for maintaining the current sourced from an upper current source substantially equal to the current sunk by a lower current source. The current source circuits include a lower reference current source operable for defining a reference current through a first biasing transistor and a duplicate device in which an output current can be established proportional to the reference current therethrough. A complementary output device is provided for producing the upper current source along with a duplicate biasing device. The duplicate complementary biasing devices are such that the current through these devices is identical and equal to the reference current. A replication feedback loop coupled to both the common connected node of the complementary output devices and the common connected node of the complementary biasing devices operates to make the voltage at these two nodes substantially identical. In this way, the current in the output devices is substantially equal in amplitude independent of the output voltage.

15 Claims, 4 Drawing Sheets

PHASE LOCKED LOOP CHARGE PUMP CIRCUIT

BACKGROUND OF THE INVENTION

The invention relates to a charge pump circuit, and in particular to a charge pump circuit for use in a phase locked loop frequency synthesizer.

Phase locked loops (PLLs) are used in wide variety of applications. Some primary uses involve data recovery, clock recovery from data streams in communication systems, and in frequency synthesizers which generally operate to use a lower frequency and synthesize a higher frequency.

Typically, a PLL frequency synthesizer will have a phase detector, a charge pump circuit, a loop filter and a voltage-controlled oscillator (VCO). The phase detector detects differences in phase between an input reference signal and a feedback signal from the VCO. The charge pump circuit generates either a positive current source (current source of fixed value $I_{up}$) to add charge to the loop filter or a negative current source (current sink of fixed value $I_{dn}$) to remove charge from the loop filter based on the error signal output from the phase detector. A third state does not change the current to the loop filter and instead provides a high impedance. The VCO uses the control voltage across the loop filter to minimize the frequency difference between the PLL feedback signal and the input reference signal.

The fundamental performance required by the PLL frequency synthesizer will depend on the performance of the charge pump circuit. The areas of critical importance include matching or good balance between the up and down currents ($I_{up}$ and $I_{dn}$), which directly relates to reference sideband performance. The operating compliance of the circuit is important in that the charge pump circuit needs to operate over a wide voltage range, while maintaining the balance of the up and down currents.

Another important aspect is that the function must be implemented efficiently in terms of the quiescent supply current, being particularly true for low power designs. A final important aspect is switching speeds, which in a charge pump circuit is critical because of the need to switch the currents on and off at high speeds.

SUMMARY OF THE INVENTION

The invention provides a charge pump circuit including current source circuits for maintaining the current sourced from an upper current source substantially equal to the current sunk by a lower current source. The current source circuits include a lower reference current source operable for defining a reference current through a first biasing transistor and a duplicate device in which an output current can be established proportional to the reference current therethrough. A complementary output device is provided for producing the upper current source along with a duplicate biasing device. The duplicate complementary biasing devices are such that the current through these devices is identical and equal to the reference current. A replication feedback loop coupled to both the common connected node of the complementary output devices and the common connected node of the complementary biasing devices operates to make the voltage at these two nodes substantially identical. In this way, the current in the output devices is substantially equal in amplitude independent of the output voltage.

In accordance with one embodiment of the invention, there is provided a circuit operable for establishing a reference current, a first output device which is driven by a low impedance output of the first biasing loop so as to establish an output current proportional to the reference current, a second biasing loop coupled to the first biasing loop and operable for establishing a biasing current which is substantially identical to the reference current, and a second output device which is driven by a low impedance output of the second biasing loop so as to establish an output current proportional to the biasing current.

In accordance with another embodiment of the invention, there is provided a charge pump circuit including a reference current loop operable for defining a reference current through a first biasing transistor and having a first low impedance output associated therewith and a circuit output node having an output voltage associated therewith. A first output transistor is coupled to the circuit output node which is driven by the first low impedance output of the reference current loop to establish an output current which is proportional to the reference current therethrough. A replication feedback loop coupled to the reference current loop at a coupling node and operable for replicating the output voltage at the coupling node such that the reference current is defined in a second biasing transistor and having a second low impedance output. A second output transistor is coupled to the circuit output node which is driven by the second low impedance output of the replication feedback loop to establish an output current which is proportional to the reference current therethrough.

In accordance with another embodiment of the invention, there is provided a charge pump circuit for use in a phase locked loop frequency synthesizer, the charge pump circuit coupled between a phase detector and a loop filter. The charge pump circuit includes a reference current loop including a first operational amplifier and a first biasing transistor, the first operational amplifier establishing a reference current through the first transistor being proportional to a reference voltage applied to the first operational amplifier, the first operational amplifier including a first low impedance output. An output node having a loop filter voltage applied thereto is provided. A first output transistor is coupled to the output node and is driven by the first low impedance output to establish an output current proportional to the reference current therethrough. A replication feedback loop includes a second operational amplifier and a second biasing transistor, the replication feedback loop being coupled to the reference current loop at a coupling node and operable for replicating the loop filter voltage at the coupling node such that the reference current is defined in the second biasing transistor which is driven by a second low impedance output of the second operational amplifier. A second output transistor is coupled to the output node which is driven by the second low impedance output to establish an output current which is proportional to the reference current therethrough.

In accordance with another embodiment of the invention, there is provided a current source circuit for use in a phase locked loop frequency synthesizer having a filter, the current source including an output node coupled to the filter so as to provide a control voltage thereto. A primary pair of complementary current sources is coupled to the output node, each of the primary current sources supplying a different one of a positive current and a negative current to the output node. A secondary pair of complementary current sources is coupled to an internal circuit node, the secondary current sources being a proportional replication of the primary current sources, the primary and secondary current sources being coupled in a manner such that the amplitude of both the positive and negative current in the primary current sources are substantially identical and proportional to the current in the secondary current sources when the voltage at the internal circuit node is equal to that of the output node. A biasing circuit establishes a reference current in the secondary current sources. Feedback means are coupled to the output node and the internal circuit node such that the voltage at the internal circuit node is substantially identical to that of the output node, thus establishing the condition in which the amplitude of the positive and negative current in the primary current sources are substantially identical.

DETAILED DESCRIPTION OF THE ILLUSTRATED EMBODIMENTS

Figure 1:
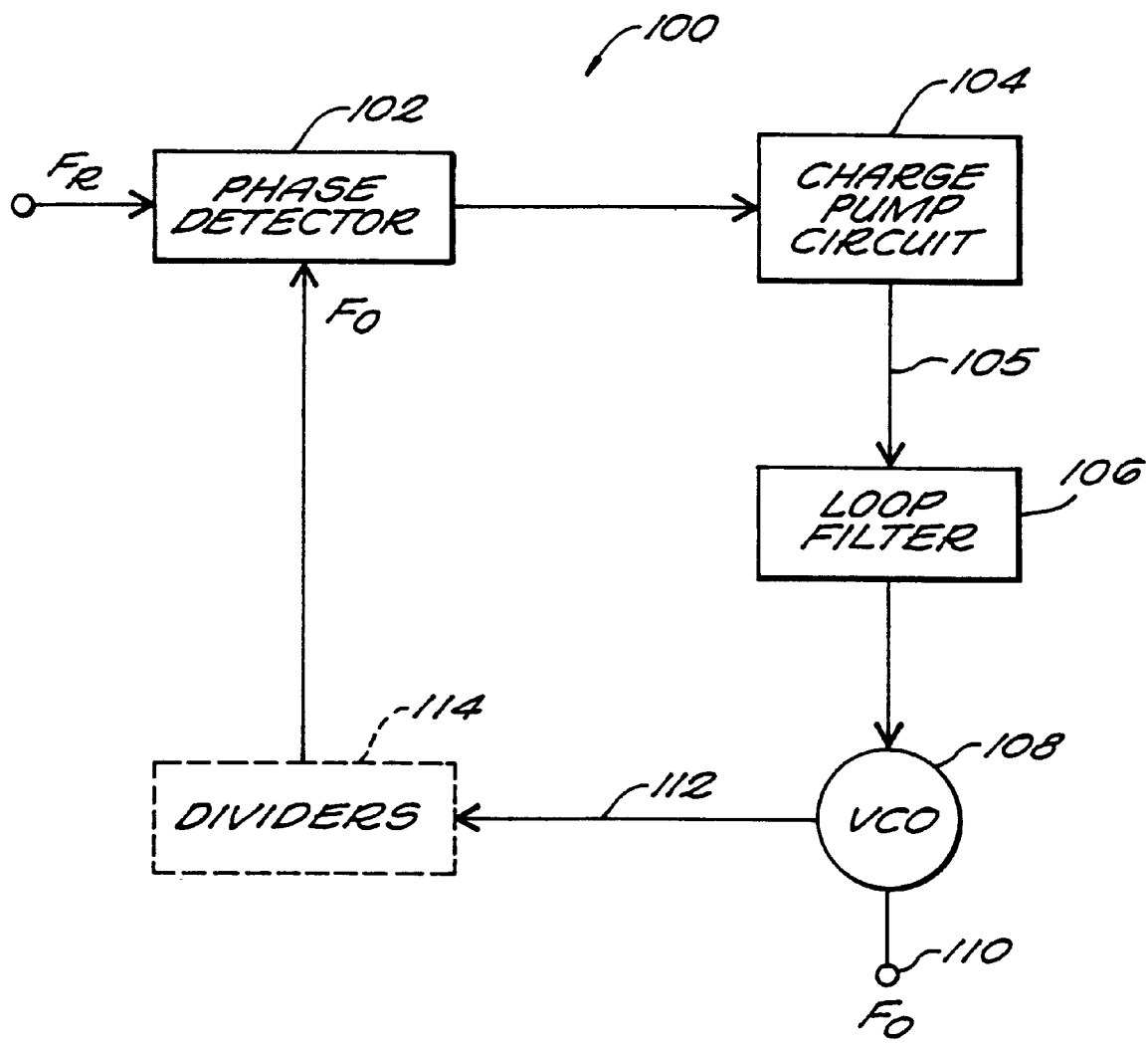
FIG. 1 is a block diagram of a PLL frequency synthesizer utilizing a charge pump circuit in accordance with the invention.

FIG. 1 is a block diagram of an exemplary PLL frequency synthesizer 100 having a charge pump circuit 104 in accordance with the invention. The synthesizer 100 includes a phase detector 102 which receives a reference signal $F_R$ from an input source (not shown). The phase detector operates to detect the difference between the reference signal and a feedback signal $F_O$, which is the output signal of the synthesizer as will be described. In response to the differences in phase, the phase detector is put into one of three states which have three corresponding outputs provided to the charge pump circuit 104.

A first state of the phase detector occurs when the phase of the reference signal is found to be greater than the feedback signal, thus the phase detector generates an up current signal (UP) to the charge pump circuit. The up current signal controls the charge pump circuit to provide a positive source current to the output 105 of the charge pump circuit. A second state occurs when the phase of the reference signal is found to be lesser than the feedback signal, thus the phase detector generates a down current signal (DN) to the charge pump circuit. The down current signal controls the charge pump circuit to provide a current sink or negative current at the output 105. If the reference signal and feedback signal are the same (phase locked condition), the phase detector generates a signal to control the charge pump circuit to generate a high impedance on the output 105.

A loop filter 106 is connected to the output 105, and serves to maintain a voltage for input to a voltage controlled oscillator (VCO) 108. The VCO 108 has an output terminal 110 on which the output signal $F_O$ is provided as the output of the synthesizer. The output signal is also fedback on line 112 to a second input of the phase detector. Frequency dividers 114 can be disposed between the VCO and phase detector if desired. Accordingly, the synthesizer operates to adjust the VCO until the reference signal and the output signal are detected as being in phase, thus the synthesizer is in a phase locked condition.

Figure 2:
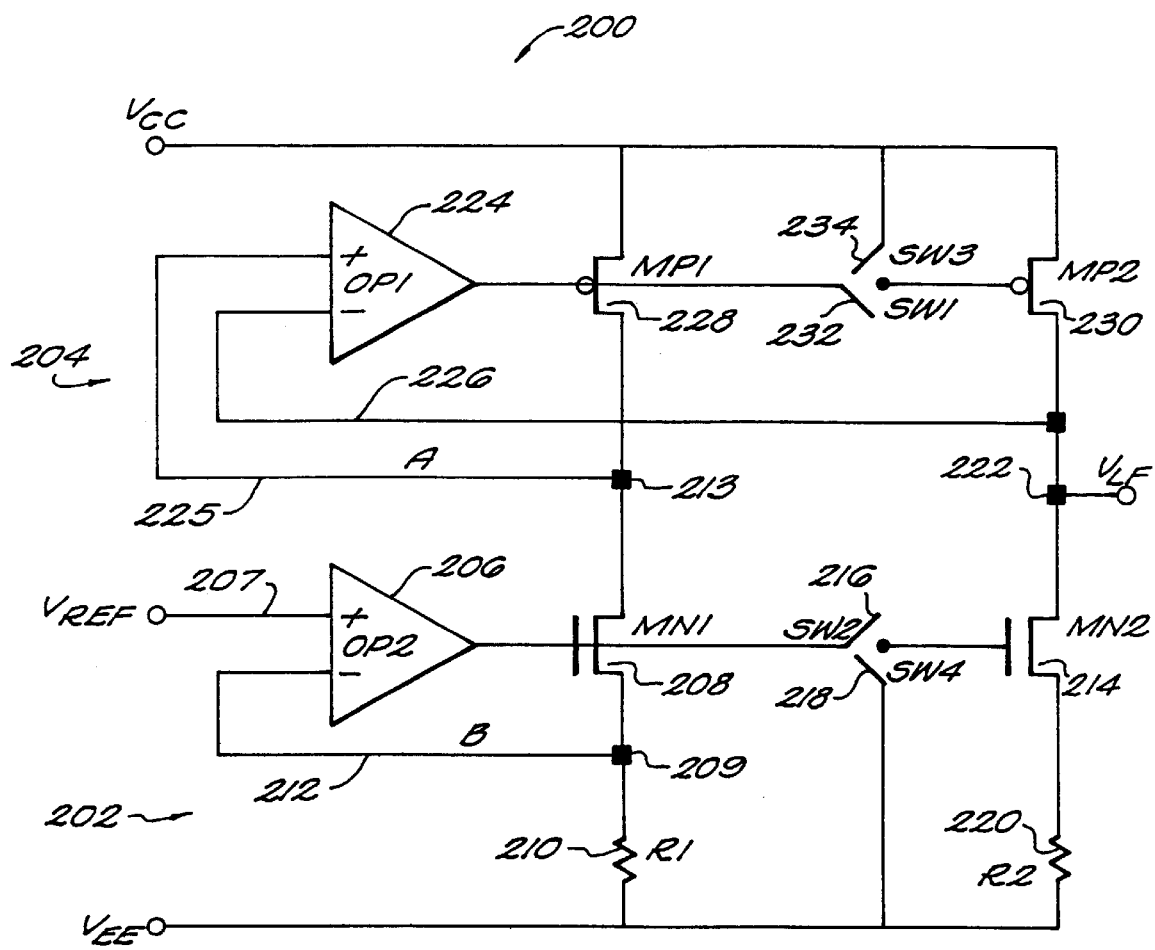
FIG. 2 is a schematic diagram of an exemplary embodiment of a charge pump circuit in accordance with the invention.

FIG. 2 is a schematic diagram of an embodiment of a charge pump circuit 200 in accordance with the invention. The circuit includes voltage supply rails $V_{CC}$ and $V_{EE}$, where $V_{CC}$ is preferably at a higher potential and $V_{EE}$ can be ground. In addition, the circuit includes two primary components, a reference current loop 202 and a replication loop 204.

The reference current loop includes an operational amplifier 206 which receives a reference voltage $V_{REF}$ at it's positive input terminal on line 207. The opamp 206 has an output connected to the gate of an n-type MOSFET transistor 208. The source of the transistor 208 is connected to a node 209, which in turn is coupled to $V_{EE}$ via a resistor 210 of value R1. The node 209 is also connected to the negative input of the opamp 206 by a feedback line 212. The drain of the transistor 208 is connected to a node 213 which is the connection point between the reference current loop 202 and the replication loop 204. The gate of the transistor 208 is coupled to the gate of an n-type MOSFET output transistor 214 via a switch 216. The gate of the output transistor 214 is coupled to the rail $V_{EE}$ via a switch 218, while it's source is coupled to $V_{EE}$ through a resistor 220 of value R2. The drain of the output transistor 214 is connected to an output node 222 for the charge pump circuit.

The replication circuit 204 includes an operational amplifier 224. The positive input terminal of opamp 224 is connected to node 213 via line 225, and the negative input terminal is connected to the output node 222 via line 226. The output of the opamp 224 is connected to the gate of a p-type MOSFET 228. The source of the transistor 228 is connected to the rail $V_{CC}$, and the drain is connected to the node 213. The gate of transistor 228 is coupled to the gate of a p-type MOSFET output transistor 230 via a switch 232. The gate of the output transistor 230 is also coupled to $V_{CC}$ via a switch 234. The source of the output transistor 230 is connected to $V_{CC}$, and the drain is connected to the output node 222.

It will be appreciated by those skilled in the art that while the illustrated embodiment is implemented with n- and p-type MOSFETS, it is possible to use bipolar transistors instead. In addition, the switches can be implemented using MOSFET or bipolar technology. The switches are activated by digital pulses provided by the output of the phase detector.

A critical feature of the illustrated embodiment of the charge pump circuit of the invention is the use of small MOSFET devices at the output (close or at minimum length with a narrow width). This configuration allows for very low leakage in the off state due to the minimized source and drain area, and fast switching due to low input capacitance. A drawback is a low output impedance giving a high current versus voltage dependency. However, the circuit compensates for the poor output impedance via the replication loop.

In operation, if the charge pump circuit 200 is in a pump up state, switch 232 is closed, switch 234 is open, switch 216 is open, and switch 218 is closed. In the pump down state, the switches are actuated oppositely. Therefore, switch 216 is closed, switch 218 is open, switch 232 is open, and switch 234 is closed. In the final high impedance state, switch 216 is open, switch 232 is open, switch 218 is closed, switch 234 is closed.

The circuit 200 operates to set up a bias current that is used as the root current which will be switched in some way to the output either in pump up or pump down form. In the illustrated embodiment, the bias current is established in the reference current loop 202 via the opamp 206, the transistor 208, and the resistor 210. It will be appreciated that the circuit 200 is configured on an integrated circuit, and that the DC reference voltage $V_{REF}$ is generated on the IC (not shown) and is generally available in some form, e.g., temperature compensated, etc., and is applied to the positive input of the opamp 206. The negative feedback via line 212 ensures that the reference voltage will be in principal exactly replicated at node 209. Due to the fact that node 209 is equal to $V_{REF}$, a bias current is established in resistor 210 that is equal to $V_{REF}$ over R1. The bias current will flow through transistor 208, assuming that opamp 206 has a high impedance input, so very little current or zero current in this case flows into the opamp 206, and all of the current that is set up is available at the drain of the transistor 208, and thus the node 213.

An important part in the biasing is that the current that is delivered to the output is independent of the output loop filter voltage provided at output node 222, which is labeled $V_{LF}$. If the circuit were configured with only a bias loop, as in classic cases, which was switched to the output, the output current would be dependent on the loop filter voltage. Accordingly, the invention utilizes the second feedback replication loop 204 as well as the reference current loop 202 to establish identical bias conditions on the transistor 208 as the output transistor 214.

The biasing feature is one of the key principles of the invention because the circuit operates such that the output transistor 230 which is the device that delivers the current sees identical bias conditions as that established on transistor 228. Accordingly, the circuit matches both the terminal voltages by use of the second feedback loop which is set up by opamp 224. The opamp 224 feeds back the loop filter voltage $V_{LF}$ to the negative terminal of the opamp such that the negative feedback loop will set the other terminal of the opamp substantially equal depending on the amount of open loop gain involved so that it is driven to almost identically the same voltage as $V_{LF}$ at node 213.

The opamp 224 and transistor 228 form a replication feedback loop and set node 213 equal to $V_{LF}$. Accordingly, the circuit has two feedback loops which force the output transistor 230 into the same bias condition as transistor 228. These devices don't necessarily need to be identical, instead the currents between them can be scaled. For example, in one embodiment the bias and output currents would be equal, thus if a milliamp is desired at the output, a milliamp would be established as the bias. Alternatively, a microamp bias current could be scaled to a milliamp output, thus providing a thousand to one step up ratio.

Next, the operation of the switching arrangements will be described. The switching arrangements occur such that switch 216 is closed and switch 218 is open, thus the voltage that is set up at the gate of transistor 208 from opamp 206 is applied to the gate of transistor 214 in the pump down condition. Due to the drain voltages being the same, the node 222 is driven into exactly the same bias condition as transistor 208. Therefore, the current in transistor 208, or a scaled version of it, will be set up in transistor 214, thus setting up the right condition to do the pump down.

The circuit operates in exactly the reverse manner in the pump up condition. The switch 232 is now closed and switch 234 is open so that output transistor 230 sees the voltage of the output of opamp 224, which is the right voltage to set the current up in transistor 230, such that the current is equal to that of transistor 228 or a scaled version of it, thus delivering the pump up current.

The final mode of operation is such that switch 216 and switch 232 are open, isolating the output transistors 230 and 214 to generate the high impedance state. Because of the charge storage on the nodes 209 and 213, it is best to actually turn the output transistors off completely. The closing of switches 218 and 234 effectively switches these devices off so they deliver essentially zero current except for leakage. Since $V_{LF}$ is driving a loop filter, which is primarily a capacitor with an associated resistor, the storage of charge at node 222 keeps these feedback loops active. Accordingly, even though the switches are open, $V_{LF}$ does not discharge and remains to set up opamp 224 in the bias state.

In review, transistors 214 and 230 are the output devices for the circuit 200. Transistors 208 and 228 form the reference current loop where the voltage at node 213 is forced to that of the loop filter voltage by the negative feedback action of opamp 224. Opamp 206 sets up the root current of the reference loop in transistor 208 to be $V_{REF}$/R1 by changing the gate voltage of transistor 208 and importantly (since the drain is set to $V_{LF}$) compensates for output impedance effects. As the loop filter voltage varies, opamp 206 changes the gate voltage to maintain the root current (which is also reflected into the transistor 228).

Switches 216, 218, 232 and 234 are switched to present the gate voltage set up on transistors 208 and 228 to the output transistors 214 and 230, respectively, thus producing the required output current. Since the reference current loop has the same conditions as the output stage, the output current is equal to the reference current. Device scaling can be used such that the reference current is a fraction of the final required current.

Several features of the charge pump circuit of the invention provide for excellent performance. The match between the up and down currents is good over a wide range of voltage outputs due to the negative feedback technique used. By matching the characteristics of opamp 224 and opamp 206, the dynamic match (when both current sources are momentarily on) is also very good. The leakage is excellent due to the very small output devices used. The circuit also has excellent noise performance. Such performance is best realized in the case where both output transistors are on, which does occur when the synthesizer is in lock for a small time period (used to overcome the finite switching time of the transistors). The negative feedback loops result in an effective current noise that is little greater than the fundamental limit due to device shot noise. The charge pump circuit of the invention is also quite efficient in the use of supply current due in part to high bias current not being required for low noise, and the fact that voltage biasing is used.

Figure 3:
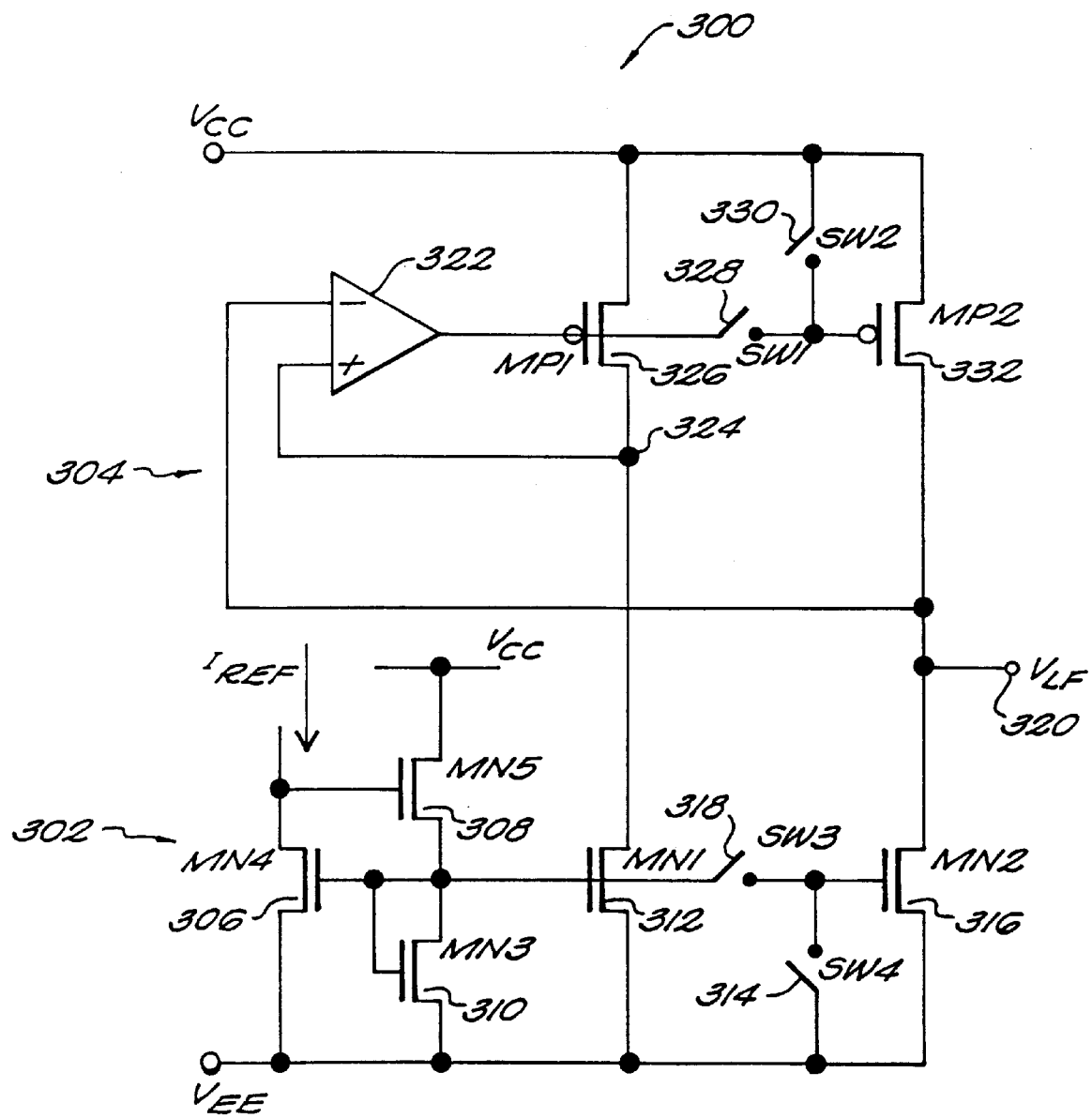
FIG. 3 is a schematic diagram of an alternative exemplary embodiment of a charge pump circuit in accordance with the invention.

FIG. 3 is a schematic diagram of an alternative embodiment of a charge pump circuit 300 in accordance with the invention. The circuit includes voltage supply rails $V_{CC}$ and $V_{EE}$, where $V_{CC}$ is preferably at a higher potential and $V_{EE}$ can be ground. In addition, the circuit includes two primary components, a reference current loop 302 and a replication loop 304. The circuit 300 is similar to circuit 200 with the difference being in the method of deriving the reference current in the reference current loop. The replication loop operates the same as with respect to circuit 200.

The reference current loop 302 includes a current mirror configured from n-type MOSFETs transistors 306 (MN4), 308 (MN5), 310 (MN3), 312 (MN1) and 316 (MN2). The source of transistor 306 is connected to $V_{EE}$ and its drain is connected to a reference current $I_{REF}$ provided from a source (not shown). The transistor 308 has a drain connected to the rail $V_{CC}$ and a source connected to the gate of transistor 306. The drain of transistor 310 is diode connected to the gates of transistors 306 and 312 and its source is connected to $V_{EE}$. The source of transistor 312 is connected to $V_{EE}$ and its drain is connected to node 324 of the replication loop 304. The gate of output transistor 316 is coupled to the gate of transistor 312 via switch 318, and to $V_{EE}$ via switch 314. The source of transistor 316 is also connected to $V_{EE}$ while its drain is connected to the output node 320.

The replication circuit 304 includes an operational amplifier 322. The negative input terminal of opamp 322 is connected to the output node 320, and the positive input terminal is connected to node 324. The output of the opamp 322 is connected to the gate of a p-type MOSFET 326. The source of the transistor 326 is connected to the rail $V_{CC}$, and the drain is connected to the node 324. The gate of transistor 326 is coupled to the gate of a p-type MOSFET output transistor 332 via a switch 328. The gate of the output transistor 332 is also coupled to $V_{CC}$ via a switch 330. The source of the output transistor 332 is connected to $V_{CC}$, and the drain is connected to the output node 320.

The current mirror arrangement of transistors 306, 308, 310 312 and 316 is such that the current in transistors 316 and 312 will have substantially the same current passing through them as transistor 306, specifically $I_{REF}$ or a multiple thereof. Transistor 310 is diode connected and has passing through it substantially the same current as transistor 306. Furthermore, the current in transistor 310 also passes through transistor 308. This configuration ensures that the common node of transistors 310 and 308 (switched by SW3) is at a suitably low impedance for driving the control gate of transistor 316.

Figure 4:
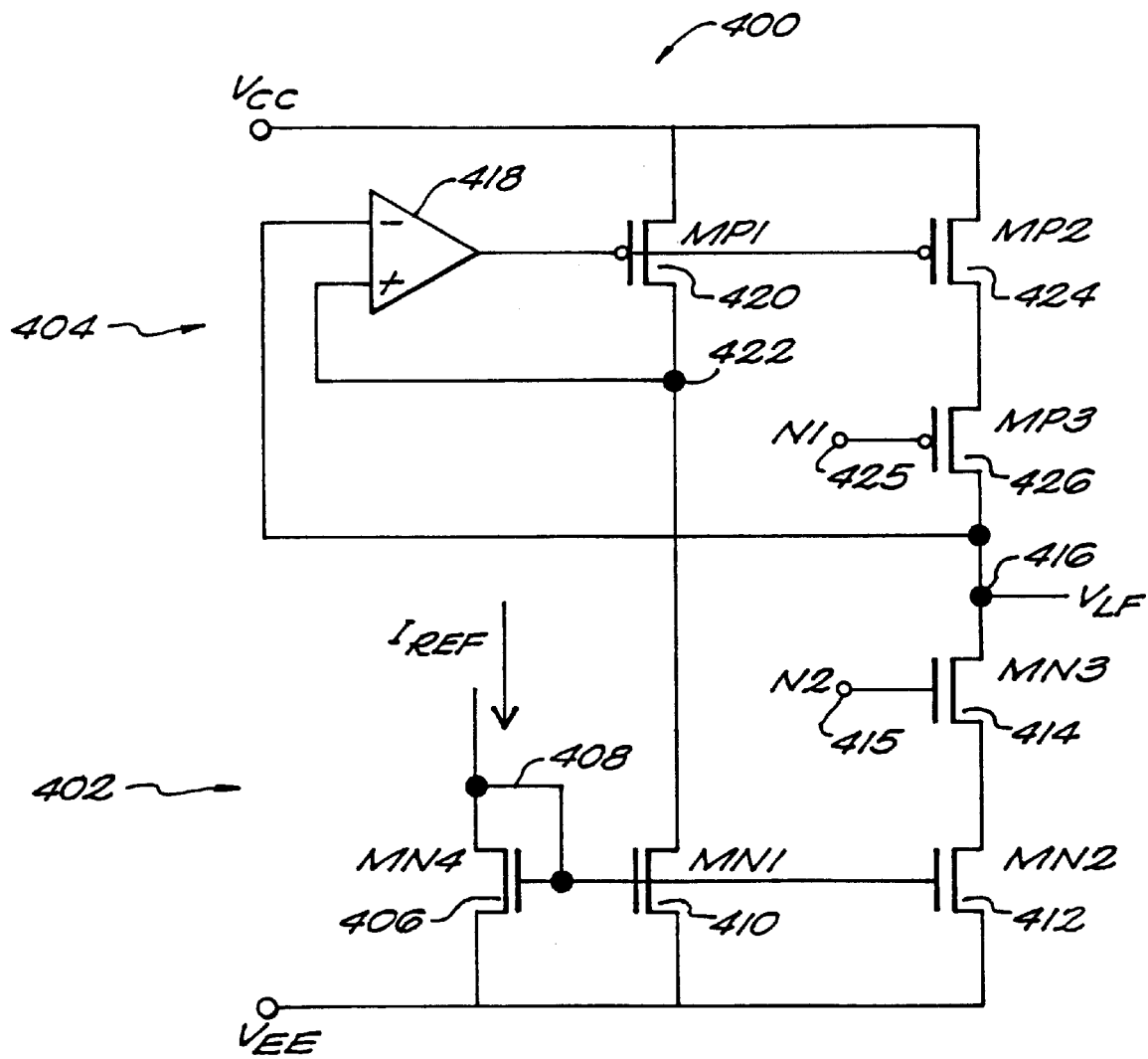
FIG. 4 is a schematic diagram of another alternative exemplary embodiment of a charge pump circuit in accordance with the invention.

FIG. 4 is a schematic diagram of another alternative embodiment of a charge pump circuit 400 in accordance with the invention. The circuit includes voltage supply rails $V_{CC}$ and $V_{EE}$, where $V_{CC}$ is preferably at a higher potential and $V_{EE}$ can be ground. In addition, the circuit includes two primary components, a reference current loop 402 and a replication loop 404.

The reference current loop 402 includes a n-type MOSFET transistor 406 having a source connected to $V_{EE}$ and its drain and gate being connected to a reference current $I_{REF}$ provided from a source (not shown). A n-type MOSFET transistor 410 has a drain connected to a coupling node 422 of the replication loop 404 and a source connected to $V_{EE}$. The gate of transistor 410 is coupled to the gates of transistor 406 and a n-type MOSFET transistor 412. The source of transistor 412 is connected to $V_{EE}$ and its drain is connected to the source of an output n-type MOSFET transistor 414. The control gate of output transistor 414 is connected to a node 415, and its drain is connected to an output node 416.

The replication circuit 404 includes an operational amplifier 418. The negative input terminal of opamp 418 is connected to the output node 416, and the positive input terminal is connected to node 422. The output of the opamp 418 is connected to the gate of a p-type MOSFET 420. The source of the transistor 420 is connected to the rail $V_{CC}$, and the drain is connected to the node 422. The gate of transistor 420 is also coupled to the gate of a p-type MOSFET transistor 424. The source of the output transistor 424 is connected to $V_{CC}$, and the drain is connected to the source of an output p-type MOSFET transistor 426. The control gate of the transistor 426 is connected to a node 425, and its drain is connected to the output node 416.

The difference between the circuit 400 and the previous embodiments is the placement of switches in series with the output transistors 412 and 424. The switches are realized with the transistors 414 and 426, such that current is switched rather than voltage. Since a voltage is no longer switched to the gates of transistors 412 and 424, the need for the gate of transistor 412 to be driven by a low impedance is removed. Therefore, a simple current mirror can be used to establish the reference current formed by transistors 410 and 406.

In circuit 400, the transistors 412 and 424 are paired as the primary complimentary current sources. This embodiment differs in that transistor 424 is connected to the output via transistor 426. Transistor 426 is active (pump up) when a pulse is received at its control gate through node 425. Similarly, the other primary current source transistor 412 is connected to the output node via transistor 414. Transistor 414 is active (pump down) when a pulse is received at its control gate through node 415.

With this method of implementing the current switching function, an alternative embodiment of realizing the reference current in the secondary current sources is possible. Specifically, the current input $I_{REF}$ is used in a conventional current mirror arrangement. The current reference circuit is configured from transistors 406, 410, and 412. Transistor 406 is connected in a diode configuration such that transistors 410 and 412 will have substantially the same current passing through them as through transistor 406, specifically $I_{REF}$ or a multiple thereof.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A charge pump circuit comprising:
   a reference current loop operable for defining a reference current through a first biasing transistor and having a first low impedance output associated therewith;
   a circuit output node having an output voltage associated therewith;
   a first output transistor coupled to said circuit output node which is driven by said first low impedance output of said reference current loop to establish an output current that is proportional to said reference current therethrough;
   a replication feedback loop coupled to said reference current loop at a coupling node and operable for replicating said output voltage at said coupling node such that said reference current is defined in a second biasing transistor and having a second low impedance output; and
   a second output transistor coupled to said circuit output node which is driven by said second low impedance output of said replication feedback loop to establish an output current that is proportional to said reference current therethrough, wherein
   said reference current loop comprises a first operational amplifier having a positive terminal coupled to a reference voltage, a negative terminal coupled to said first biasing transistor, and an output defining said first low impedance output, and said first low impedance output is selectively switched to said first output transistor.

2. The charge pump circuit of claim 1, wherein said replication feedback loop comprises a second operational amplifier having a positive terminal coupled to said coupling node, a negative terminal coupled to said circuit output node, and an output defining said second low impedance output.

3. The charge pump circuit of claim 2, wherein said second low impedance output is selectively switched to said second output transistor.

4. The circuit of claim 3, wherein said first and second low impedance outputs are alternately selectively switched to said first and second output transistors respectively.

5. The circuit of claim 4, wherein said first and second output transistors are alternately selectively switched off.

6. The circuit of claim 4, wherein said first and second output transistors are simultaneously switched off to generate a high impedance output at said circuit output node.

7. A charge pump circuit for use in a phase locked loop frequency synthesizer, said charge pump circuit coupled between a phase detector and a loop filter, said circuit comprising:
- a reference current loop including a first operational amplifier and a first biasing transistor, said first operational amplifier establishing a reference current through said first transistor being proportional to a reference voltage applied to said first operational amplifier, said first operational amplifier including a first low impedance output;
- an output node having a loop filter voltage applied thereto;
- a first output transistor coupled to said output node and being driven by said first low impedance output to establish an output current proportional to said reference current therethrough;
- a replication feedback loop including a second operational amplifier and a second biasing transistor, said replication feedback loop being coupled to said reference current loop at a coupling node and operable for replicating said loop filter voltage at said coupling node such that said reference current is defined in said second biasing transistor which is driven by a second low impedance output of said second operational amplifier; and
- a second output transistor coupled to said output node which is driven by said second low impedance output to establish an output current which is proportional to said reference current therethrough, wherein
- said first operational amplifier has a positive terminal coupled to said reference voltage and a negative terminal coupled to said first biasing transistor, and wherein said first low impedance output is selectively switched to said first output transistor via a first switch.

8. The charge pump circuit of claim 7, wherein said second operational amplifier has a positive terminal coupled to said coupling node and a negative terminal coupled to said output node.

9. The charge pump circuit of claim 8, wherein said second low impedance output is selectively switched to said second output transistor via a second switch.

10. The charge pump circuit of claim 9, wherein said first and second low impedance outputs are alternately selectively switched to said first and second output transistors, respectively.

11. The charge pump circuit of claim 10, wherein said first and second output transistors are alternately selectively switched off via third and fourth switches, respectively.

12. The charge pump circuit of claim 10, wherein said first and second output transistors are simultaneously switched off to generate a high impedance output at said output node.

13. The charge pump circuit of claim 11, wherein said first, second third and fourth switches are responsive to control signals from said phase detector.

14. A circuit comprising:
- a first biasing loop operable for establishing a reference current, said first biasing loop including a first operational amplifier and a first transistor;
- a first output device which is driven by a low impedance output of said first biasing loop so as to establish an output current proportional to said reference current;
- a second biasing loop coupled to said first biasing loop and operable for establishing a biasing current which is substantially identical to said reference current, said second biasing loop including a second operational amplifier and a second transistor; and
- a second output device which is driven by a low impedance output of said second biasing loop so as to establish an output current proportional to said biasing current, wherein
- said first and second output devices comprise first and second output transistors, respectively, and wherein said low impedance outputs of said first and second biasing loops are alternately selectively switched to said first and second output devices, respectively.

15. The circuit of claim 14, wherein said low impedance outputs of said first and second biasing loops are alternately selectively switched to said first and second output devices, respectively.

* * * * *